(12) United States Patent
Hirose et al.

(10) Patent No.: US 6,924,915 B2
(45) Date of Patent: Aug. 2, 2005

(54) OSCILLATION DEVICE, OPTICAL DEFLECTOR USING THE OSCILLATION DEVICE, AND IMAGE DISPLAY DEVICE AND IMAGE FORMING APPARATUS USING THE OPTICAL DEFLECTOR, AND METHOD OF MANUFACTURING THE OSCILLATION DEVICE

(75) Inventors: Futoshi Hirose, Kanagawa (JP); Yasuhiro Shimada, Kanagawa (JP); Takahisa Kato, Polo Alto, CA (US)

(73) Assignee: Canon Kabushiki Kaisha, Tokyo (JP)

( * ) Notice: Subject to any disclaimer, the term of this patent is extended or adjusted under 35 U.S.C. 154(b) by 160 days.

(21) Appl. No.: 10/640,046

(22) Filed: Aug. 14, 2003

(65) Prior Publication Data

US 2004/0105139 A1 Jun. 3, 2004

(30) Foreign Application Priority Data

Aug. 26, 2002 (JP) ........................................ 2002-246008

(51) Int. Cl.$^7$ .............................................. G02B 26/08
(52) U.S. Cl. ........................ 359/224; 359/198; 359/199; 310/36; 335/222; 335/229
(58) Field of Search .................................. 359/198, 199, 359/223, 224, 212–214, 290–291, 296, 298, 900; 310/36, 40 MM, 66, 333; 335/222–224, 229

(56) References Cited

U.S. PATENT DOCUMENTS

| 5,606,447 A | | 2/1997 | Asada et al. ................. 359/199 |
| 5,969,465 A | * | 10/1999 | Neukermans et al. ........ 310/333 |
| 6,232,861 B1 | * | 5/2001 | Asada ......................... 335/222 |

FOREIGN PATENT DOCUMENTS

| JP | 2000/235152 | 8/2000 |
| JP | 2001/075042 | 3/2001 |

* cited by examiner

*Primary Examiner*—James Phan
(74) *Attorney, Agent, or Firm*—Fitzpatrick, Cella, Harper & Scinto

(57) ABSTRACT

Disclosed is an oscillation device comprising: a first movable plate adapted to be oscillated about a first rotation axis; a first elastic supporting portion for oscillatively supporting the first movable plate; a supporting substrate for fixing the first elastic supporting portion; a first magnetic field generating portion arranged in a position remote from the first movable plate; a second movable plate adapted to be oscillated about a second rotation axis; and a second elastic supporting portion fixed to the first movable plate for oscillatively supporting the second movable plate, in which a first coil is provided in the first movable plate to be turned round the second movable plate, and in which a second magnetic field generating portion is provided in the second movable plate. The oscillation device is capable of: operating at a high speed with large displacement; enhancing an energy efficiency; and oscillating about two axes.

16 Claims, 11 Drawing Sheets

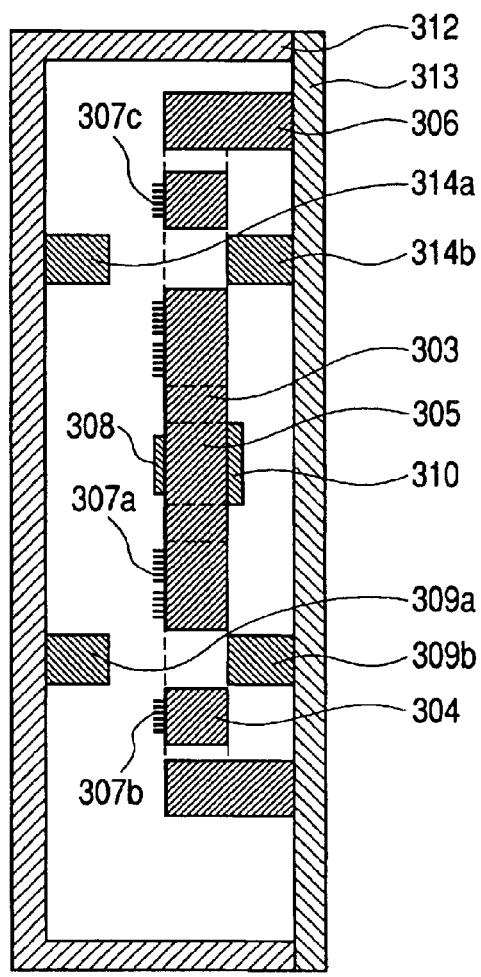
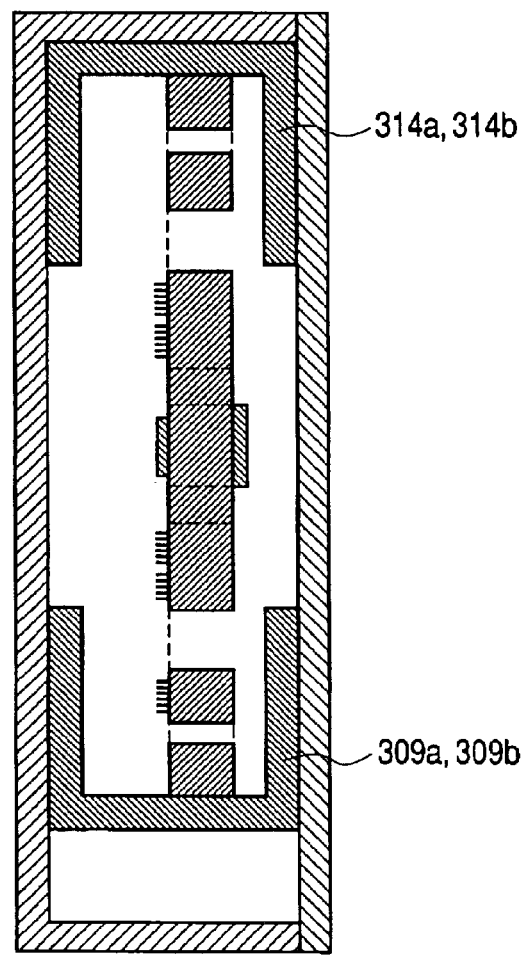
FIG. 7A
FIG. 7B

OSCILLATION DEVICE, OPTICAL DEFLECTOR USING THE OSCILLATION DEVICE, AND IMAGE DISPLAY DEVICE AND IMAGE FORMING APPARATUS USING THE OPTICAL DEFLECTOR, AND METHOD OF MANUFACTURING THE OSCILLATION DEVICE

BACKGROUND OF THE INVENTION

1. Field of the Invention

The present invention relates to an oscillation device, an optical deflector using the oscillation device, and an image display device and an image forming apparatus using the optical deflector, and a method of manufacturing the oscillation device.

2. Related Background Art

In recent years, an electromagnetic actuator has been tried to be formed on a substrate made of silicon or the like by utilizing a semiconductor process. If the electromagnetic actuator is formed by utilizing the semiconductor process, a stator, a moving element and an electromagnetic coil can be collectively formed, and hence a process for joining and bonding is unnecessary. As a result, the stator, the moving element and the electromagnetic coil can be aligned with one another with high accuracy. In addition, since those elements can be formed on a massive scale at a time, reduction in cost can be expected.

As one of examples of application of the electromagnetic actuator formed on a substrate, there is an optical deflector. An optical deflector is used in an image forming apparatus such as a laser beam printer, an image display device such as a head mounted display, or an image input device such as a bar code reader. There is seen even such a device in which a light can be deflected with respect to two axes with one optical deflector.

As an example in which an electromagnetic actuator formed on a substrate is applied to an optical deflector and deflection is possible with respect to two axes, there is known one disclosed in Japanese Patent Application Laid-Open No. 2000-235152. FIG. 10 is a plan view showing an optical deflector which is described as one of examples in Japanese Patent Application Laid-Open No. 2000-235152. This optical deflector is a torsion beam optical deflector, and is used as a deflector for two-dimensionally scanning an objective surface with a laser beam. This torsion beam optical deflector is constituted by an inner y-axis direction deflection portion 1003 and an outer x-axis direction deflection portion 1004. The inner y-axis direction deflection portion 1003 is constituted by a substrate 1001 having a groove portion 1002, a movable plate 1006 which is oscillatively supported by an axis portion 1005 and which has a thin film showing hard magnetism formed on its surface, a pair of thin film electromagnet portions 1007 for oscillating the movable plate 1006, and a mirror 1008 provided on the movable plate 1006. The surfaces having the movable plate 1006 and the thin film electromagnet portions 1007 formed thereon are slightly shifted in a direction of thickness. The movable plate 1006 is oscillated with the Coulomb force generated between a magnetic field generated by causing an AC current of 60 kHz as a structural resonance frequency of the y-axis direction deflection portion 1003 to flow through the thin film electromagnet portions 1007 and a magnetic field generated in the hard magnetism thin film formed in the movable plate 1006, and an applied light is deflected by the mirror 1008. It is possible to realize low power consumption because of the driving method utilizing the mechanical resonance. The outer x-axis direction deflection portion 1004 is the same in structure as the inner y-axis direction deflection portion 1003, and hence the driving method in the former is also the same as that in the latter. A driving frequency of this optical deflector is 60 kHz (in the y-axis), and 60 Hz (in the x-axis), and a deformation angle of the movable plate 1006 is ±13.67 degrees (in the y-axis direction).

In addition, as another example thereof, an electromagnetic actuator is tried to be miniaturized using the semiconductor process and permanent magnets, and the resulting product is applied to an optical deflector. In such cases, by using the permanent magnets, a magnetic field can be relatively readily formed, and also by lightening the moving element, high-speed operation can be expected. As one example thereof, there is known one disclosed in U.S. Pat. No. 5,606,447. FIG. 11 is a plan view showing an optical deflector which is described as one of examples in U.S. Pat. No. 5,606,447. In this optical deflector, a flat plate-like movable plate having a mirror is oscillatively supported with respect to a substrate by two torsion springs. In FIG. 11, reference numeral 801 designates a galvano-mirror; 802, a silicon substrate; 803, an upper side glass; 804, a lower side glass; 805, a movable plate; 806, a torsion spring; 807, a plane coil; 808, a total reflection mirror; 809, a contact pad; and 810A, 810B, 811A and 810C, permanent magnets. The driving plane coil 807 for generating a magnetic field by the current flow therethrough is provided in a peripheral portion of the movable plate 805, and the permanent magnets 810A, 810B; 811A, 810C are provided in pairs on the upper and lower surfaces of the semiconductor substrate through the upper and lower glass substrates 803 and 804 so that an electrostatic magnetic field is given only to both the sides of the driving plane coil parallel to the axial direction of the torsion spring 806. In this optical deflector, a current is caused to flow through the driving plane coil 807. Then, the Lorentz force F (not shown) acts on a direction in accordance with the Fleming's left hand rule on the basis of a direction of the current caused to flow through the plane coil 807 and a direction of the magnetic flux density provided by the permanent magnets 810A, 810B; 811A, 810C to thereby generate a moment adapted to oscillate the movable plate 805. At the time when the movable plate 805 has been oscillated, a spring reaction F' (not shown) is generated due to spring rigidity of the torsion spring 806. If an AC current is caused to flow through the plane coil 807 to repeatedly operate the optical deflector, then the movable plate 805 having a light reflecting surface is oscillated to thereby scan an objective surface with the reflected light. In U.S. Pat. No. 5,606,447, there is also disclosed, as another example, an optical deflector in which the galvano-mirror 801 is installed instead of the total reflection mirror 808 to form a nesting structure to enable the two-axis scanning.

In addition, although not applied to an electromagnetic actuator, there is also an optical deflector which is aimed to realize the two-axis direction scanning with a simple structure using movable plates of a nesting structure. In this case, a shape of a movable plate having a deflection portion is parallelogram to thereby enable the two-axis direction scanning using a driving unit in one-axis rotating direction. As one example thereof, there is known an optical deflector disclosed in Japanese Patent Application Laid-Open No. 2001-75042. FIG. 12 is a plan view showing one of examples disclosed in Japanese Patent Application Laid-Open No. 2001-75042. In FIG. 12, reference numeral 901 designates an optical deflector; 902, a first torsion spring;

903, a second torsion spring; 904, a first movable plate; 905, a second movable plate; 906, a supporting substrate; 907a and 907b, electrodes; and 908, a fixed portion. The first movable plate 904 is supported to the supporting substrate 906 through the fixed portion 908 and the first torsion spring 902. The first movable plate 904 supports the second movable plate 905 through the second torsion spring 903 orthogonal to the first torsion spring 902. A shape of the second movable plate 905 is the parallelogram. The center of gravity G of the second movable plate 905 is located at an intersection between a first rotation axis A and a second rotation axis B. In addition, the supporting substrate 906 has the two electrodes 907a and 907b formed thereon, and thus a suitable voltage can be selectively applied across the electrodes 907a and 907b and a rear face of the first movable plate 904. A deflection portion such as a mirror is installed on the second movable plate 905 so that the resultant structure acts as an optical deflector. In a state of no application of a voltage, each of the first movable plate 904 and the second movable plate 905 is located at a neutral position. If a suitable voltage is alternately applied to the electrodes 907a and 907b, then an electrostatic force alternately acts on the left and right end portions of the first movable plate 904 to oscillate the first movable plate 904 with the first rotation axis A as a center. At the same time, a rotation moment acts on the second movable plate 905 to oscillate the second movable plate 905 with the second rotation axis B as a center due to asymmetry of its mass.

However, any of the above-mentioned optical deflectors has the following problems.

In the optical deflector disclosed in Japanese Patent Application Laid-Open No. 2000-235152 shown in FIG. 10, the high-speed operation round the two axes is realized. However, since the core constituting the thin film electromagnet portion 1007 is a thin film formed through the sputtering process, there is a limit to an increase of its cross section. For this reason, if a large current is caused to flow through the thin film electromagnet portion 1007, then a magnetic flux is inevitably saturated. Hence, it is difficult to further increase the deformation angle. In addition, the surfaces having the movable plate 1006 and the thin film electromagnet portion 1007 formed thereon are only slightly shifted in a direction of thickness, and hence from this viewpoint as well, it is difficult to further increase the deformation angle.

In the optical deflector disclosed in U.S. Pat. No. 5,606,447 shown in FIG. 11, if a deflection angle of a light during light scanning is intended to be increased, then it is necessary to increase a distance between the upper and lower glass substrates 803 and 804, and the movable plate 805. Thus, a relative distance between the permanent magnets 810A, 810B; 811A, 810C and the driving plane coil 807 becomes large accordingly, which results in reduction in the magnetic flux density in the plane coil 807, so that a large amount of current is required for the driving.

In the optical deflector described in Japanese Patent Application Laid-Open No. 2001-75042 shown in FIG. 12, the shape of the second movable plate 905 having the deflection portion is the parallelogram. Thus, if a light having a circular beam spot such as a laser beam is tried to be deflected, then the size of the second movable plate 905 needs to be increased more than the area which a light strikes. Thus, if the size of the second movable plate 905 is increased, then it is difficult to expect higher speed operation and more miniaturization.

SUMMARY OF THE INVENTION

The present invention has been made in order to solve the above-mentioned problems, and an object of the present invention is to provide an oscillation device which is capable of: operating at a high speed with large displacement; enhancing an energy efficiency; being manufactured inexpensively; and oscillating about two axes, an optical deflector using the oscillation device, and an image display device and an image forming apparatus using the optical deflector, and a method of manufacturing the oscillation device.

According to the present invention, there is provided an oscillation device comprising:

a first movable plate adapted to be oscillated about a first rotation axis;

a first elastic supporting portion for oscillatively supporting the first movable plate;

a supporting substrate for fixing the first elastic supporting portion;

a first magnetic field generating portion arranged in a position remote from the first movable plate;

a second movable plate adapted to be oscillated about a second rotation axis; and a second elastic supporting portion fixed to the first movable plate for oscillatively supporting the second movable plate, in which a first coil is provided in the first movable plate to be turned round the second movable plate, and in which a second magnetic field generating portion is provided in the second movable plate.

BRIEF DESCRIPTION OF THE DRAWINGS

FIGS. 7A and 7B are respectively a cross sectional view taken along the line 7A—7A of FIG. 6A and a cross sectional view showing a modification of FIG. 7A useful in explaining Example 3 of an optical deflector according to the present invention;

DESCRIPTION OF THE PREFERRED EMBODIMENTS

Figure 1A:
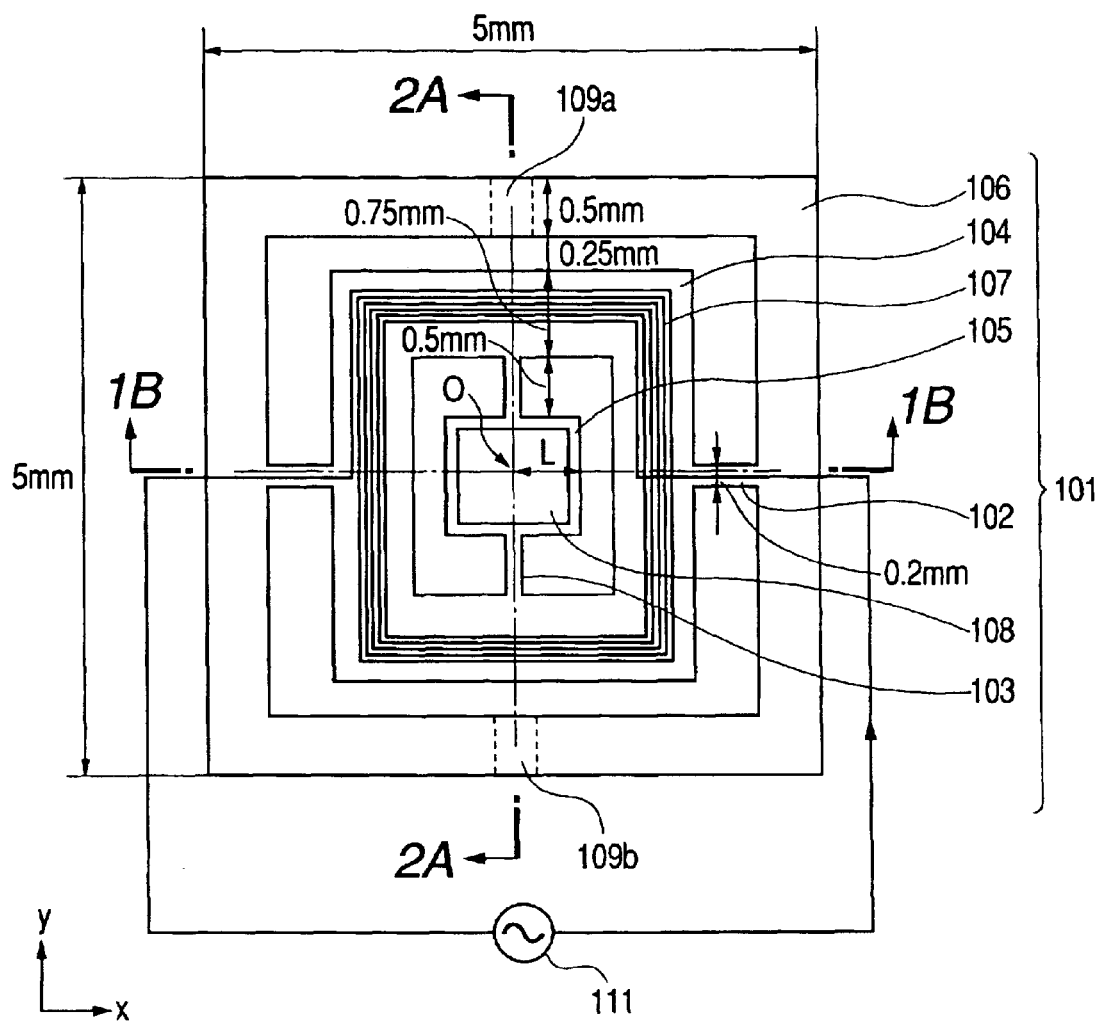
FIGS. 1A and 1B are respectively a plan view and a cross sectional view taken along the line 1B—1B of FIG. 1A useful in explaining Example 1 of an optical deflector according to the present invention.

An oscillation device of the present invention made in order to solve the above-mentioned problems comprises: a first movable plate adapted to be oscillated about a first rotation axis; a first elastic supporting portion for oscillatively supporting the first movable plate; a supporting substrate for fixing the first elastic supporting portion; a first magnetic field generating portion arranged in a position remote from the first movable plate; a second movable plate adapted to be oscillated about a second rotation axis; and a second elastic supporting portion fixed to the first movable plate for oscillatively supporting the second movable plate, in which a first coil is provided in the first movable plate so as to be turned round the second movable plate, and a second magnetic field generating portion is provided in the second movable plate. As in this structure, the two movable plates are arranged in a nesting style, and moreover, the second magnetic field generating portion, the coil and the first magnetic field generating portion are respectively installed in the inner second movable plate, in the outer first movable plate, and in the position remote from the first movable plate, whereby the oscillation can be made about two axes with one coil, and hence a structure is very simple. Thus, the oscillation device is expected to be miniaturized and hence is inexpensive. In addition, a magnitude of a current caused to flow through the coil is changed to allow the operation of the movable plates to be controlled. Also, the coil is provided so as to be turned round the second movable plate to allow the magnetic flux to effectively act on the second magnetic field generating portion provided on the second movable plate to enhance the energy efficiency. Moreover, the supporting substrate, and the first and second magnetic field generating portions can be readily arranged with respect to the first and second movable plates with such a positional relationship as not to disturb the oscillating movement of the first and second movable plates. Hence, it is also possible to increase the displacement of the movable bodies.

The following forms become possible on the basis of the above-mentioned basic structure.

The first magnetic field generating portion can be installed on the supporting substrate. Installing the first magnetic field generating portion on the supporting substrate in such a manner may allow the whole device to be miniaturized.

The first coil can be formed into a quadrangle in shape so as to be turned round the second movable plate. Forming the first coil into a quadrangle in shape so as to be turned round the second movable plate in such a manner allows the generation force in a direction of oscillating the movable plate about the rotation axis to be readily obtained to enhance the energy efficiency.

A direction of the magnetic field generated by the second magnetic field generating portion and a direction of the second rotation axis can be made orthogonal to each other. In addition, a direction of the magnetic field generated by the first magnetic field generating portion and a direction of the first rotation axis can be made orthogonal to each other. As in those structures, positional relationships between magnetic poles of the magnetic field generating portions and the rotation axes of the movable plates are devised, whereby it is possible to obtain generation forces in directions of effectively oscillating the movable plates about the rotation axes, respectively, to enhance the energy efficiency.

The first coil can have at least one of a lead wire extending in a direction substantially perpendicular to the direction of the magnetic field generated by the first magnetic field generating portion, and a lead wire extending in a direction substantially perpendicular to the direction of the magnetic field generated by the second magnetic field generating portion. As in this structure, positional relationships between the magnetic poles of the magnetic field generating portions and the lead wires of the coil are devised, whereby it is possible to obtain generation forces in directions of effectively oscillating the movable plates about the rotation axes, respectively, to enhance the energy efficiency. This typical example shows the above-mentioned coil having a quadrangle shape.

A second coil can be further installed on the first movable plate, and the first movable plate can have a first opening in an inner periphery of the second coil. Then, an N pole and an S pole of the first magnetic field generating portion can be arranged in a direction substantially perpendicular to the first movable plate and in a position remote from the first movable plate so as to sandwich therebetween the first opening. The magnetic poles of the magnetic field generating portion are arranged as in this structure, whereby it is possible to readily determine a distance of the magnetic poles and the movable plate, and also it is possible to optimize the structure in correspondence to a desired displacement of the movable plate. In addition, the coil is used as the driving unit and a magnitude of a current caused to flow through the coil is changed to allow the operation of the movable plate to be controlled. Moreover, the first movable plate has the opening, whereby there is no interference between the first magnetic field generating portion and the first movable plate, and hence a displacement of the movable plate can be taken on a large scale.

The second coil and a third coil can be further installed on the first movable plate so as to sandwich therebetween the first rotation axis and the first movable plate can further have a second opening in an inner periphery of the third coil. Then, an N pole and an S pole of a third magnetic field generating portion can also be arranged in a direction substantially perpendicular to the first movable plate and in a position remote from the first movable plate so as to sandwich therebetween the second opening. As in this structure, the plural coils are installed on the first movable plate so as to sandwich therebetween the first rotation axis, whereby the generation force can be made large as compared with the structure having the second coil, and hence a displacement of the movable plate can be taken on a large scale.

At least two of the first coil, the second coil and the third coil can be electrically connected in series with each other. Electrically connecting two or more coils in series with each other in such a manner allows the two or more coils to be driven by one current source. In other words, the movable plates can be driven round the two axes with one current source, respectively, and as a result, the structure can be highly simplified.

As a magnet, a permanent magnet or an electromagnet can be used. However, since a permanent magnet has no Joule heat loss, the energy efficiency is improved. In addition, the use of a permanent magnet allows the constitution to be simple and to be miniaturized.

A current containing a frequency component containing at least one of a torsional resonance frequency of the first movable plate and a torsional resonance frequency of the second movable plate is applied to the first, second and third coils, and a torsional resonance movement is caused to the respective movable plates, whereby a displacement angle of at least one of the first movable plate and the second movable plate can be made larger.

At least two of the first movable plate, the first elastic supporting portion, the second movable plate, the second elastic supporting portion, and the supporting substrate can be formed of the same member. As in this structure, for example. the movable plates, the elastic supporting portions, and the supporting substrate are formed of the same member, whereby the assembly process can be made unnecessary to realize reduction in cost. In addition, the alignment between the movable plates and the supporting substrate becomes unnecessary to reduce dispersion among lots.

At least one of the first movable plate, the first elastic supporting portion, the second movable plate, the second elastic supporting portion and the supporting substrate can be made of single crystal silicon. For example, the movable plates and the elastic supporting portions are made of single crystal silicon as in this structure to reduce the attenuation coefficients of the elastic supporting portions. Thus, when the driving is carried out with the resonance frequencies, a large Q value can be obtained. In addition, since the fatigue failure due to the repetitive deformation as in metal materials is not caused, it is possible to structure a long life optical deflector or the like.

At least one of the first coil, the second coil, and the third coil can be composed of a plane coil. While any type of coil may be available, if a plane coil or a coil formed by laminating plane coils is used, then the movable plates can be lightened and miniaturized.

An optical deflector of the present invention made in order to solve the above-mentioned problems is an optical deflector using the above-mentioned oscillation device, in which a deflection portion for deflecting an incident light is provided in the second movable plate. With this structure, it is possible to provide a very miniature and inexpensive optical deflector which can deflect a light with respect to two axes. The deflection portion has a mirror, a lens or a diffraction grating for example. When the deflection portion is composed of a mirror, it is possible to provide an optical deflector which is easy to be manufactured and which is light in mass of the movable portions. When the deflection portion is composed of a lens, it is possible to provide a transmission type optical deflector having a large deflection angle. Also, since a range of light deflection can be provided on the side opposite to the optical deflector with respect to an incident direction of a light, the degrees of freedom for design and arrangement of the portions of the device are increased. In addition, when the deflection portion is composed of a diffraction grating, an incident light can be deflected in the form of plural beams.

In addition, an image display device of the present invention made in order to solve the above-mentioned problems has a light source, the above-mentioned optical deflector for deflecting a light emitted from the light source, and an image display surface on which the light deflected by the optical deflector is projected. The light is projected thereon through an optical element such as a lens, a mirror or a diffraction grating. As in this structure, the above-mentioned optical deflector is applied to an image display device, whereby it is possible to provide a very miniature and inexpensive image display device.

In addition, an image forming apparatus of the present invention made in order to solve the above-mentioned problems has a light source, the above-mentioned optical deflector for deflecting a light emitted from the light source, and a photosensitive material on which the light deflected by the optical deflector is projected. The light is projected thereon through an optical element such as a lens, a mirror or a diffraction grating. As in this structure, the above-mentioned optical deflector is applied to an image forming apparatus, whereby it is possible to provide a very miniature and inexpensive image display device.

Moreover, a method of manufacturing an oscillation device or an optical deflector of the present invention for solving the above-mentioned problems comprises: forming movable plates, elastic supporting portions and a supporting substrate from a substrate; forming a coil in the first movable plate; forming a second magnetic field generating portion in the second movable plate; and forming a first magnetic field generating portion in the supporting substrate. Also, the method may include forming a deflection portion in the movable plate. As a result, it is possible to manufacture an oscillation device such as an optical deflector which is simple in structure and which can deflect a light with respect to two axes. In addition, the movable plates and the elastic supporting portions can be formed at a time. Moreover, the alignment between the movable plates and the supporting substrate is unnecessary, and the assembly process is unnecessary to thereby enable promotion of low cost.

In the above-mentioned manufacturing method, the forming of the movable plates, the elastic supporting portions and the supporting substrate from the substrate can be carried out by utilizing the reactive ion etching method or the etching method using an alkali solution. As in the former, carrying out the reactive ion etching allows the movable plates and the elastic supporting portions to be stably formed into respective shapes with high accuracy. As in the latter, carrying out anisotropic etching utilizing an etching rate difference in silicon crystal face using the alkali solution allows the movable plates and the elastic supporting portions to be stably formed into respective shapes with high accuracy. Also, since the etching rate is higher than that in case of the reactive ion etching, process time can be shortened, which leads to cost down.

In addition, at least one of the step of forming a second magnetic field generating portion in the second movable plate, and the step of forming a first magnetic field generating portion in the supporting substrate can be carried out by utilizing plating method. Forming the magnetic field generating portions in such a manner by utilizing the plating method allows the assembly process to be unnecessary, which leads to low cost. Also, the alignment between the movable plates and the supporting substrate is unnecessary to reduce the dispersion among lots. Moreover, the magnetic field generating portion can also be formed thick and at a high speed as compared with the case utilizing the evaporation method or the sputtering method.

Examples will hereinafter be described in detail to clarify the embodiments of the present invention with reference to the accompanying drawings.

First of all, reference numerals in FIGS. 1A and 1B, 2A and 2B, 3A to 3H, 4, 5A to 5C, 6A and 6B, 7A and 7B, 8 and 9 will hereinbelow be described. In those figures, reference numerals 101, 201 and 301 designate optical deflectors; 102, 202 and 302, first torsion springs; 103, 203 and 303, second torsion springs; 104, 204 and 304, first movable plates; 105, 205 and 305, second movable plates; 106, 206 and 306, supporting substrates; 107, a coil; 108, 208 and 308, deflection portions; 109*a*, 109*b*, 209*a*, 209*b* and 310, first permanent magnets; 110, 210, 309*a* and 309*b*, second permanent magnets; 111, 211*a*, 211*b*, 311*a*, 311*b* and 311*c*, current sources; 113 and 114, photo resist films; 115, a silicon dioxide film; 204*a*, an opening; 207*a* and 307*b*, first coils; 207*b* and 307*b*, second coils; 212 and 312, covers; 213 and 313, supporting stages; 307*c*, a third coil; 314*a* and 314*b*, third permanent magnets; 501 and 601, optical deflectors; 502 and 602, laser light sources; 503 and 603, lenses or lens groups; 504 and 604, write lenses or lens groups; 505, a plane of projection; and 606, a photosensitive member.

EXAMPLE 1

Figure 1B:
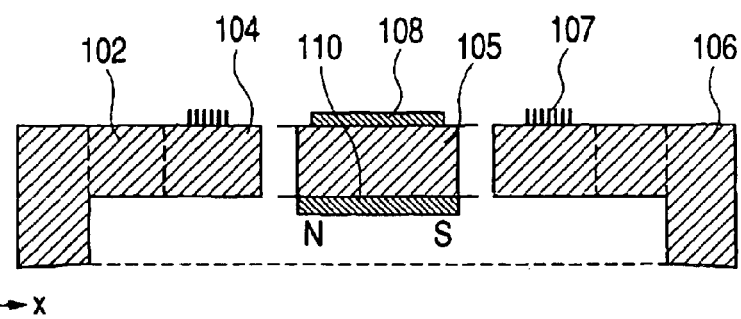
Figure 2A:
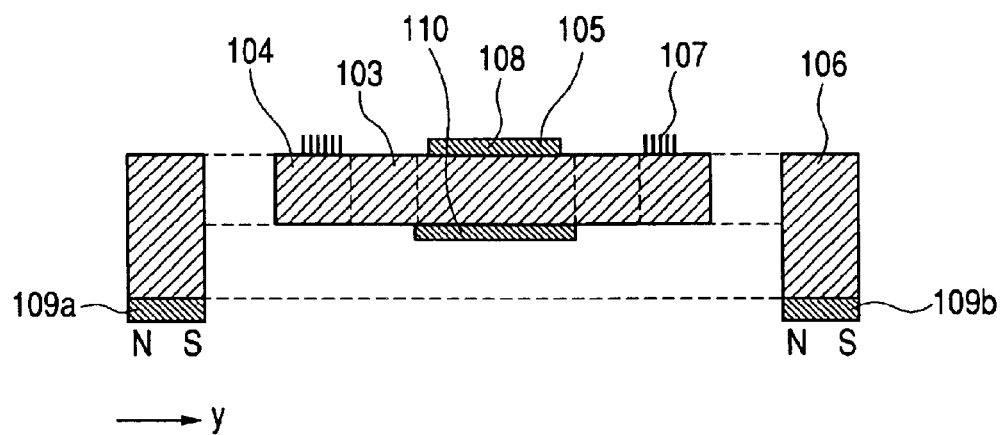
FIGS. 2A and 2B are respectively a cross sectional view taken along the line 2A—2A of FIG. 1A, and a bottom view useful in explaining Example 1 of an optical deflector according to the present invention.
Figure 2B:
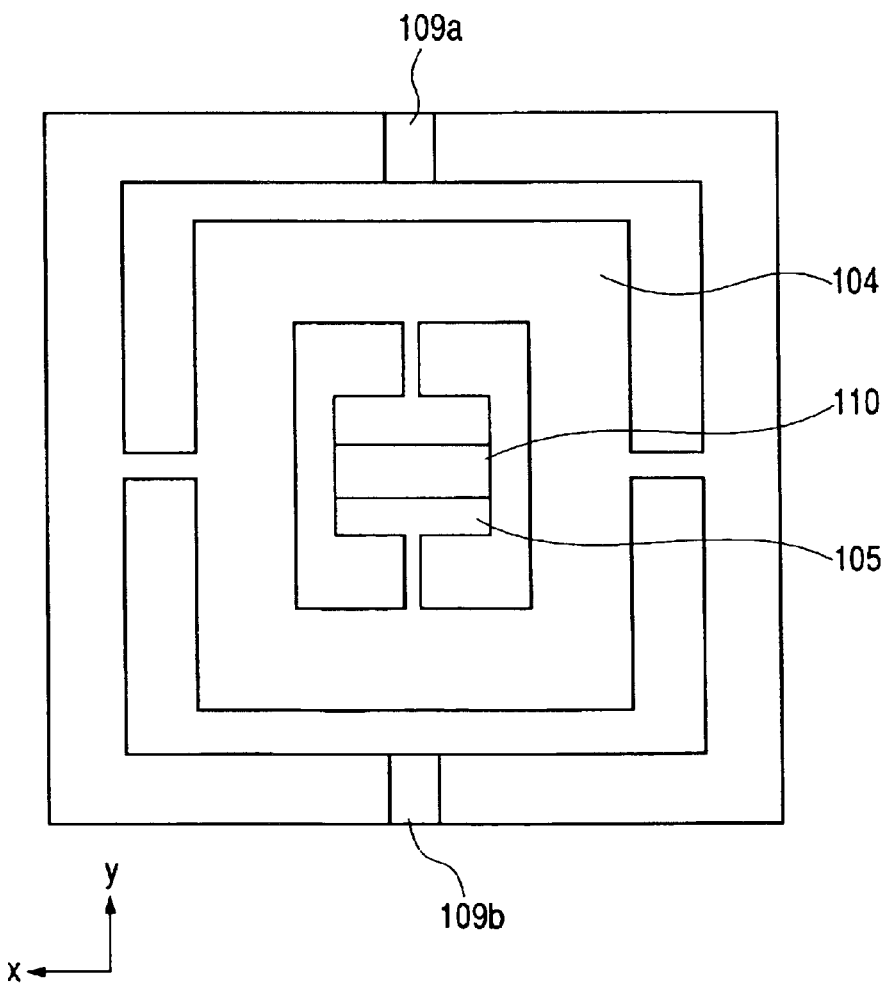

Example 1 of the present invention will hereinbelow be described in detail with reference to FIGS. 1A and 1B, FIGS. 2A and 2B, and FIGS. 3A to 3H. First of all, a structure of Example 1 will now be described in detail. FIGS. 1A and 1B, and FIGS. 2A and 2Ba show a structure of an optical deflector according to this example. FIG. 1A is a plan view, FIG. 1B is a cross sectional view taken along the line 1B—1B of FIG. 1, FIG. 2A is a cross sectional view taken along the line 2A—2A of FIG. 1A, and FIG. 2B is a bottom view. In FIGS. 1A and 1B, and FIGS. 2A and 2B, reference numeral 101 designates the optical deflector a size of which is as shown in FIG. 1A. The supporting substrate 106 oscillatively supports the first movable plate 104 through the first torsion spring 102. In addition, the first movable plate 104 oscillatively supports the second movable plate 105 through the second torsion spring 103 orthogonal to the first torsion spring 102. A size of the second movable plate 105 is 1 mm×1 mm. The supporting substrate 106, the first torsion spring 102, the second torsion spring 103, the first movable plate 104 and the second movable plate 105 are formed integrally with one another through the semiconductor process. In this figure, there are provided two of the first torsion springs and the second torsion springs, respectively. A pair of torsion springs are respectively positioned on the same axis. The respective pair of torsion springs are positioned at both ends of the movable plates connected to the respective torsion springs. The respective movable plates can stop or do a reciprocating motion slantly about the axis of the connected torsion spring as a center.

The feature of this example is that the first movable plate 104 has the coil 107 formed thereon, and the second movable plate 105 has the deflection portion 108 formed thereon. The coil 107 is made of low resistance metal such as copper or aluminum, and the first movable plate 104, the first torsion spring 102 and the supporting substrate 106 are electrically insulated from one another. The deflection portion 108 is composed of an optical element such as a mirror, a lens or a diffraction grating. Moreover, as shown in FIG. 2B, the first permanent magnets 109*a* and 109*b*, and the second permanent magnet 110 are installed on a rear face of the supporting substrate 106, and on a rear face of the second movable plate 105, respectively. For magnetic poles of the first permanent magnets 109*a* and 109*b*, an N pole and an S pole have only to confront each other, and hence may not be as shown in FIG. 2B. For example, even if one U-like permanent magnet is installed instead of the first permanent magnets 109*a* and 109*b*, the N pole and the S pole can confront each other. While magnetic poles of the second permanent magnet 110 are as shown in FIG. 2B, the N pole and the S pole may also be replaced with each other. Each of the first permanent magnets 109*a* and 109*b*, and the second permanent magnet 110 is made of a material in which a hard magnetic substance such as samarium-cobalt or neodymium-iron-boron is magnetized. In addition, each of the first permanent magnets 109*a* and 109*b*, and the second permanent magnet 110 may include a magnetic yoke made of a ferromagnetic substance such as iron, nickel, cobalt, or an alloy thereof. The current source 111 is electrically connected in series with the coil 107. While in this example, the first permanent magnets 109*a* and 109*b* and the second permanent magnet 110, and the deflection portion 108 are installed on the rear face of the supporting substrate 106, and on the surface of the supporting substrate 106, respectively, either the rear faces or surfaces will do.

Next, description will hereinbelow be given with respect to the operation of the optical deflector according to this example.

First of all, description will now be given with respect to the operation of the second movable plate 105 which is oscillated about the y-axis, i.e., with the second torsion spring 103 as a center. If a current is caused to flow from the current source 111 into the coil 107 in a direction indicated by an arrow, then magnetic poles (an N pole is generated in an upper surface and an S pole is generated in a lower surface) corresponding to the current caused to flow through the coil 107 are generated in the upper surface and the lower surface of the coil 107, respectively. A generated magnetic field M is proportional to the product of the current I caused to flow through the coil 107 and the number N of turns of the coil 107. The magnetic field H acts on the magnetic poles of the second permanent magnet 110 so that the second movable plate 105 is oscillated with the second torsion spring 103 as a center. A generated torque T is expressed in the form of the product of magnetization m of the second permanent magnet 110 and the magnetic field H. Consequently, it is understood that the generated torque T is proportional to the current I caused to flow through the coil 107.

On the other hand, the second movable plate 105 is oscillated to thereby twist the second torsion spring 103. Then, a relationship between a spring reaction F' of the second torsion spring 103 generated thereby and a displacement angle φ of the second movable plate 105 is expressed as the following formula (1):

$$\phi = ((F' \times L) \times 1)/(2 \times G \times Ip) \quad (1)$$

where G is a modulus of transverse elasticity, L is a distance from a central axis of the second torsion spring 103 to a point of force, l is a length of the torsion spring portion 103, and Ip is a cross section secondary pole moment. Then, the second movable plate 105 is oscillated up to a position where the generated torque T and F'×L are balanced with each other. Consequently, it is understood that the displacement angle φ of the second movable plate 105 is proportional to the current I caused to flow through the coil 107. Thus, controlling the current caused to flow through the coil 107 allows the displacement angle φ of the second movable plate 105 to be controlled.

Next, description will now be given with respect to the operation of the first movable plate 104 which is oscillated about the x-axis, i.e., with the first torsion spring 102 as a center. The magnetic field is formed in such a direction as to cross the coil 107 by the first permanent magnets 109*a* and 109*b* which are respectively installed on both the sides of the first movable plate 104 so as to sandwich therebetween the first torsion spring 102. Similarly to the case of the y-axis, if a current is caused to flow from the current source 111 into the coil 107 in the direction indicated by the arrow, then a force is generated for the coil 107 in a direction according to the Fleming's left hand rule. That is to say, a vertical force is generated in each end portion of the first movable plate 104 so that the first movable plate 104 is oscillated with the first torsion spring as a center. A generated force F is proportional to the product of a magnetic field B formed by the first permanent magnets 109*a* and 109*b*, and the current I caused to flow through the coil 107. Consequently, it is understood that the generated torque T is proportional to the current I caused to flow through the coil 107. The resultant displacement angle φ, similarly to the case of the y-axis, is obtained using formula (1).

As mentioned above, by causing the current to flow through the coil 107, the second movable plate 105 having the deflection portion 108 can be driven with respect to the two axes. With respect to a driving method, the current is caused to flow from the current source 111 into the coil 107, whereby the first movable plate 104 and the second movable plate 105 can be retained while being slanted and can be oscillated. In addition, a torsional resonance frequency of the respective the first movable plate 104 and the second movable plate 105 is designed so as to be different, and the optical deflector is driven with AC drive having the torsional resonance frequencies of the first movable plate 104 or the second movable plate 105 to thereby be able to make a displacement angle of one axis larger. Also, the first movable plate 104 and the second movable plate 105 are driven with the current obtained by superposing the resonance frequency of the first movable plate 104 and the resonance frequency of the second movable plate 105, so that displacement angle in the two axis directions can be made larger. Moreover, it is also possible that the displacement angle of the second movable plate 105 is detected with a displacement angle sensor (not shown) to change the current caused to flow from the current source 111 into the coil 107 to thereby control the motion of the second movable plate 105.

Next, processes for manufacturing the optical deflector will hereinbelow be described in detail with reference to FIGS. 3A to 3H each showing a cross section taken along the line O-2A of FIG. 1A. It should be noted that for the purpose of making the processes easy to understand, the size is shown in FIGS. 3A to 3H in an exaggerated form.

Figure 3A:
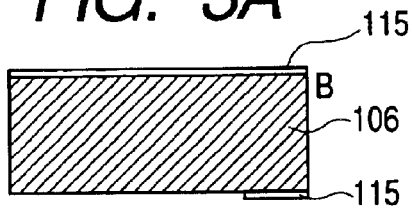
FIGS. 3A, 3B, 3C, 3D, 3E, 3F, 3G and 3H are respectively cross sectional views useful in explaining manufacturing processes of Example 1 of an optical deflector according to the present invention.

First of all, as shown in FIG. 3A, a surface of the supporting substrate 106 (its thickness is about 500 μm) made of single crystal silicon is oxidized in a thermal oxidation furnace or the like to form a silicon dioxide film 115 with a thickness of about 1 μm on the surface. Then, the silicon dioxide film 115 is patterned by utilizing the wet etching method using hydrofluoric acid or the like, or the reactive ion etching method or the like using fluorine-based gas.

Figure 3B:
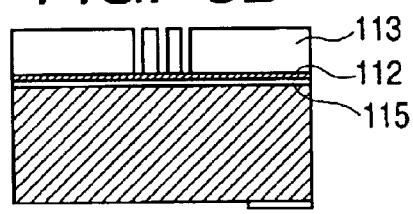

Next, as shown in FIG. 3B, after a titanium film with a thickness of about 50 Å has been formed as a seed electrode 112 on the surface of the silicon dioxide film 115 by utilizing the electroplating, a film having a thickness of about 1,000 Å and made of gold, copper or the like is formed thereon by utilizing the evaporation method, the sputtering method or the like. Then, a photo resist film 113 with a thickness of about 60 μm is formed thereon to be patterned and used as a mask for the plating. In this case, SU-8 (manufactured by MICROCHEM CORP.) as photo resist suitable for formation of a thick film is used for the photo resist film 113.

Figure 3C:
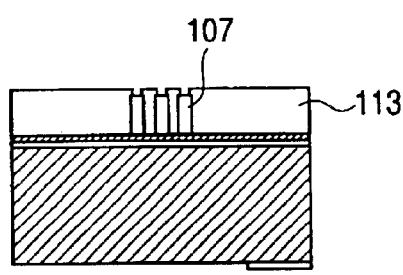
Figure 3D:
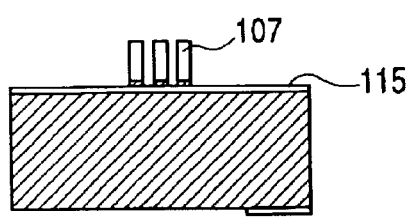

Next, as shown in FIG. 3C, a copper film with a thickness of about 50 μm is formed thereon by utilizing the electro-copper plating or the electroless copper plating to form the coil 107. Then, as shown in FIG. 3D, the photo resist film 113 is removed by using heated N-methyl pyrolidone. Moreover, the seed electrode 112 is removed by utilizing the reactive ion etching method or the ion milling method.

Figure 3E:
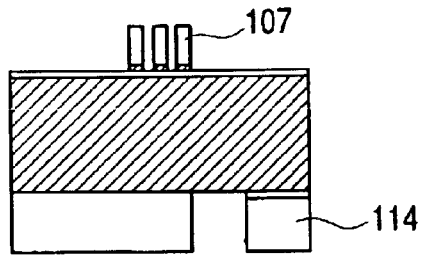

Next, as shown in FIG. 3E, after a photo resist film 114 with a thickness of about 3 μm has been formed on the rear face of the supporting substrate 106, it is patterned. In this case, AZ P4620 (manufactured by Hoechst) as photo resist suitable for formation of a thick film is used for the photo resist film 114.

Figure 3F:
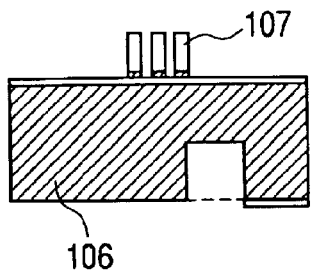

Next, as shown in FIG. 3F, the supporting substrate 106 is selectively etched away with the photo resist film 114 as an etching mask by about 200 μm from the rear face by utilizing the inductively coupled plasma reactive ion etching method to obtain a desired thickness. Then, the photo resist film 114 is removed.

Figure 3G:
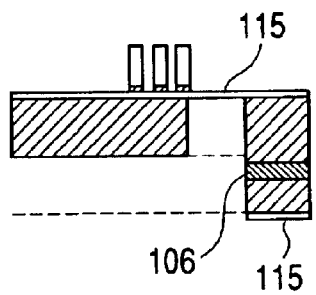

Next, as shown in FIG. 3G, the supporting substrate 106 is selectively etched away from the rear face with the silicon dioxide film 115 as an etching mask until it is selectively perforated by utilizing the inductively coupled plasma reactive ion etching method.

Figure 3H:
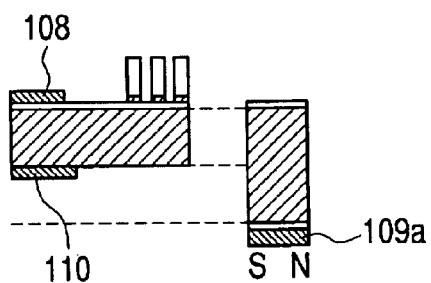

Next, as shown in FIG. 3H, the silicon dioxide film 115 is selectively etched away from the rear face of the supporting substrate 106 by utilizing the wet etching method using hydrofluoric acid or the like, or the reactive ion etching method. Moreover, the deflection portion 108, the first permanent magnets 109a and 109b (not shown) and the second permanent magnet 110 are formed by utilizing the plating, the sputtering or the like. These permanent magnets may also be formed by utilizing a method of bonding permanent magnets having desired sizes, or a method of applying and solidifying a paste-like adhesive which is mixed with powders of rare earth magnets.

EXAMPLE 2

Figure 4:
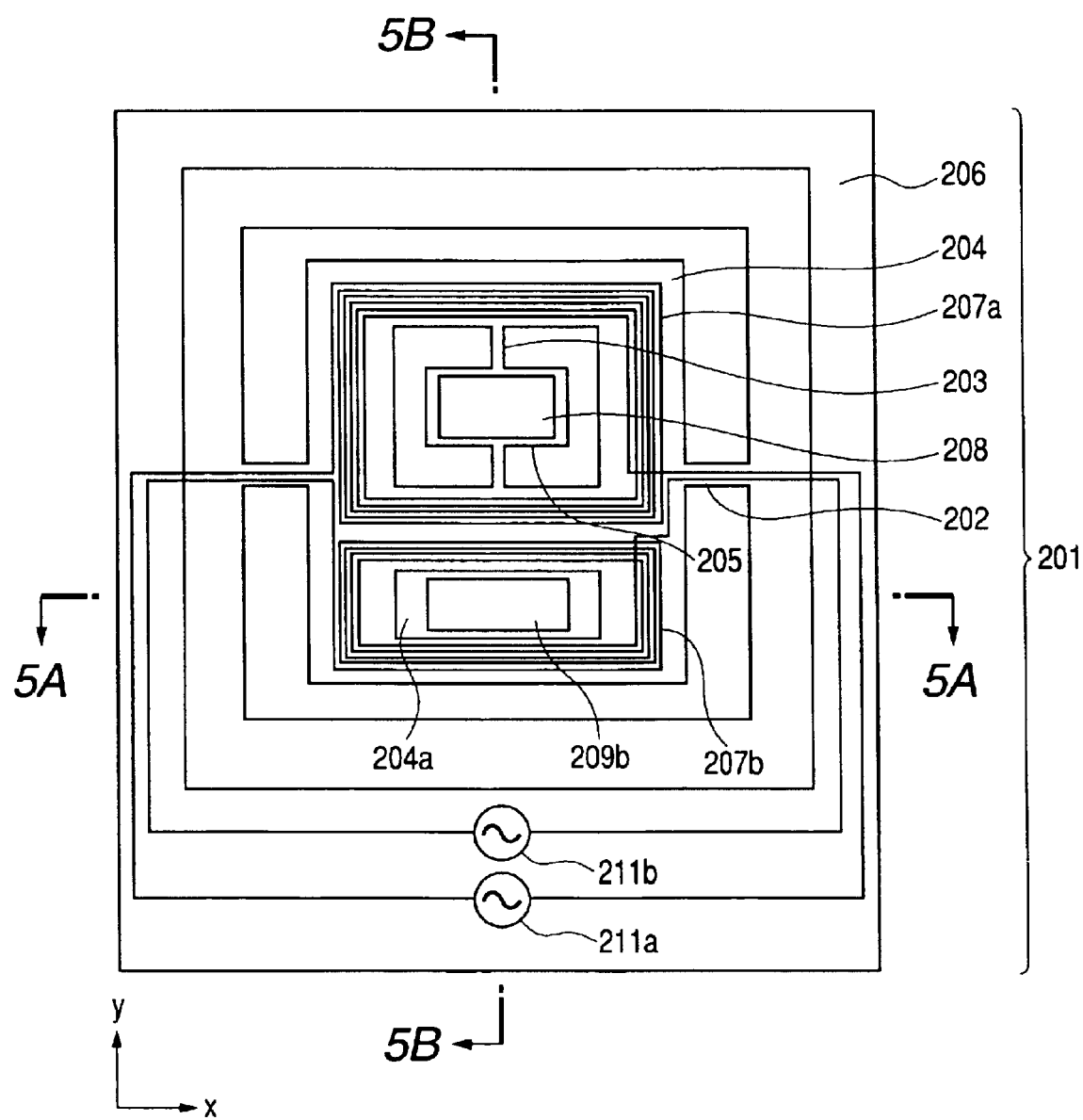
FIG. 4 is a plan view useful in explaining Example 2 of an optical deflector according to the present invention.
Figure 5A:
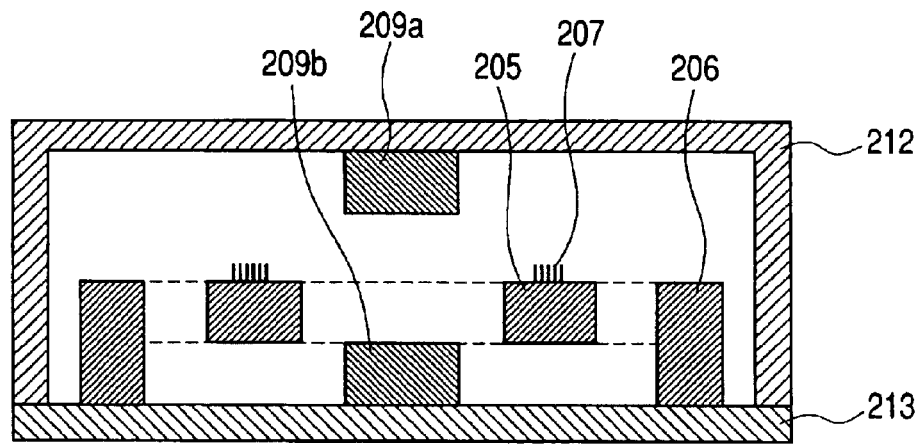
FIGS. 5A, 5B and 5C are respectively a cross sectional view taken along the line 5A—5A of FIG. 4, a cross sectional view taken along the line 5B—5B of FIG. 4, and a cross sectional view showing a modification of FIG. 5B useful in explaining Example 2 of an optical deflector according to the present invention.
Figure 5B:
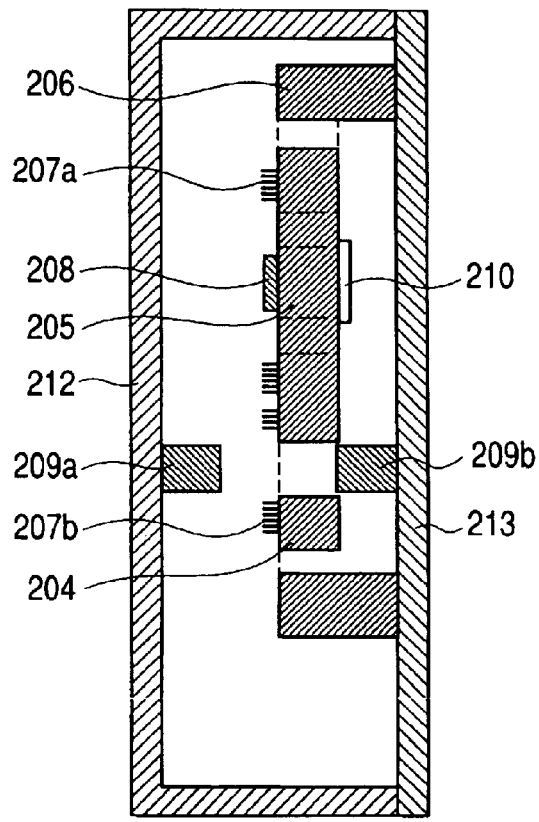

Next, Example 2 of the present invention will hereinbelow be described in detail. FIG. 4, and FIGS. 5A to 5C are respectively views useful in explaining an optical deflector according to Example 2 of the present invention. FIG. 4 is a plan view, FIG. 5A is a cross sectional view taken along the line 5A—5A of FIG. 4, and FIG. 5B is a cross sectional view taken along the line 5B—5B of FIG. 4. A basic structure, a driving method, a manufacturing method are substantially the same as those of above Example 1. In FIG. 4 and FIGS. 5A to 5C, reference numeral 201 designates an optical deflector; 202, a first torsion spring; 203, a second torsion spring; 204, a first movable plate; 205, a second movable plate; 206, a supporting substrate; 207a, a first coil; 207b, a second coil; 208, a deflection portion; 209a and 209b, first permanent magnets; 210, a second permanent magnet; 211a and 211b, current sources; 212, a cover; and 213, a supporting stage. In FIG. 4, for the purpose of making a structure easy to understand, the first permanent magnet 209a and the cover 212 are not illustrated.

The feature of Example 2 is that the first permanent magnets 209a and 209b are installed so as to vertically sandwich therebetween the second coil 207a on the first movable plate 204, and their opposite magnetic poles are different from each other. In addition, the first movable plate 204 has an opening portion 204a to avoid the mechanical interference between the first movable plate 204 and the first permanent magnets 209a and 209b. The first and second coils 207a and 207b are electrically connected to the current sources 211a and 211b, respectively. An opening portion (not shown) is formed in the cover 212 to function as an optical path for a beam.

Figure 5C:
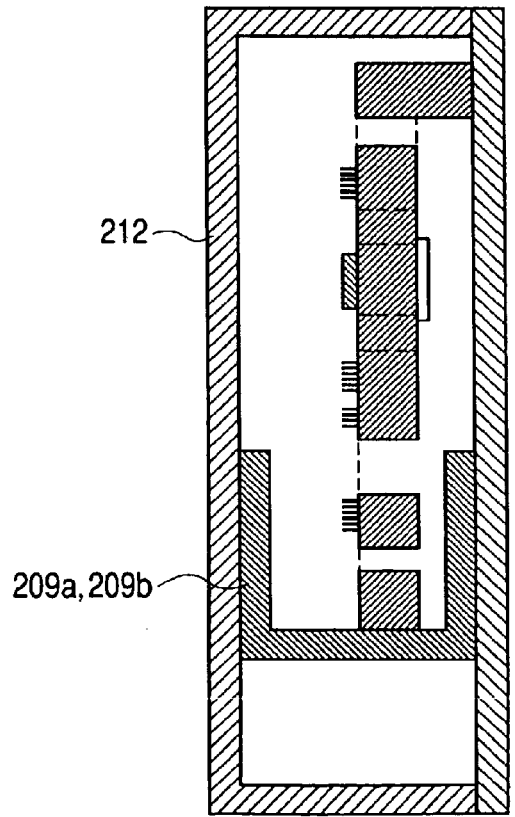

The principles of driving of the second movable plate 205 round the y-axis, i.e., with the second torsion spring 203 as a center are the same as those in the case of Example 1 in which the second movable plate 105 is driven round the y-axis. Also, the principles of driving of the first movable plate 204 round the x-axis, i.e., with the first torsion spring 202 as a center are basically the same as those in the case of Example 1 in which the first movable plate 104 is driven round the x-axis although the arrangement of the first permanent magnets 209a and 209b is slightly different from that in the case of Example 1. That is to say, the first permanent magnets 209a and 209b are arranged as shown in FIG. 4 and FIGS. 5A to 5C, whereby a torque can be obtained with the first torsion spring 202 as a center for the first movable plate 204. With respect to the first permanent magnets, U-like permanent magnet 209a, 209b in which the first permanent magnets 209a and 209b in FIG. 5B are integrated with each other may be arranged as shown in FIG. 5C. According to the constitution, it is possible that magnetic flux density generated at the magnetic pole is made larger than the case shown in FIG. 5B.

Currents are caused to flow from the current sources 211a and 211b into the first coil 207a and the second coil 207b, respectively, whereby the second movable plate 205 having the deflection portion 208 can be oscillated about the two axes. The first coil 207a and the second coil 207b may also be electrically connected in series with each other. In this case, only one of the current sources 211a and 211b becomes unnecessary.

The optical deflector of this example structured as described above can deflect a light beam with respect to the two axes with a simple structure since the permanent magnets and the coils are arranged as shown in FIG. 4, and FIGS. 5A, 5B and 5C. In addition, since measures are taken such that there is no mechanical interference between the movable plates and the permanent magnets, it becomes possible to take large displacement angles of the movable plates.

EXAMPLE 3

Figure 6A:
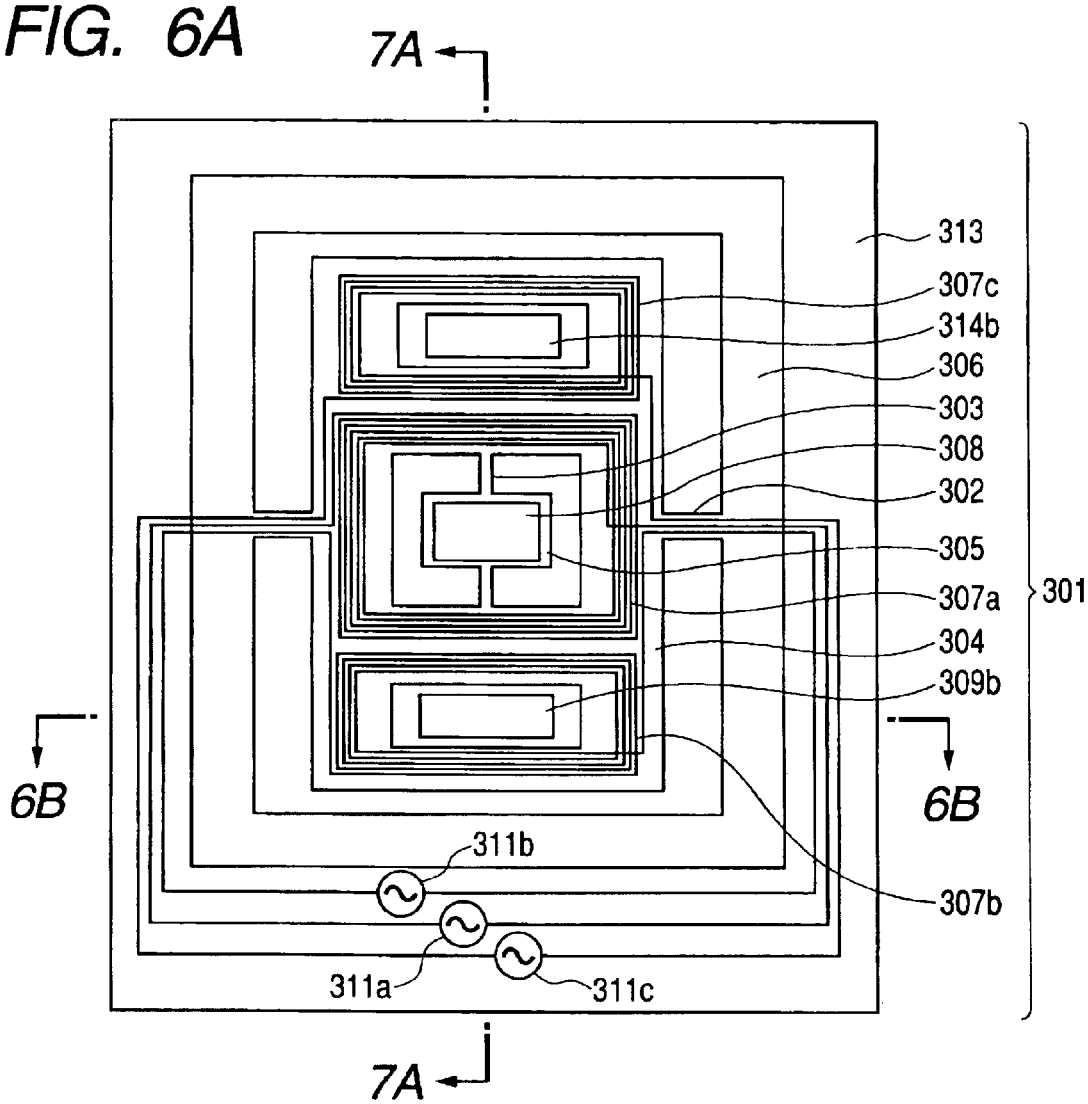
FIGS. 6A and 6B are respectively a plan view and a cross sectional view taken along the line 6B—6B of FIG. 6A useful in explaining Example 3 of an optical deflector according to the present invention.
Figure 6B:
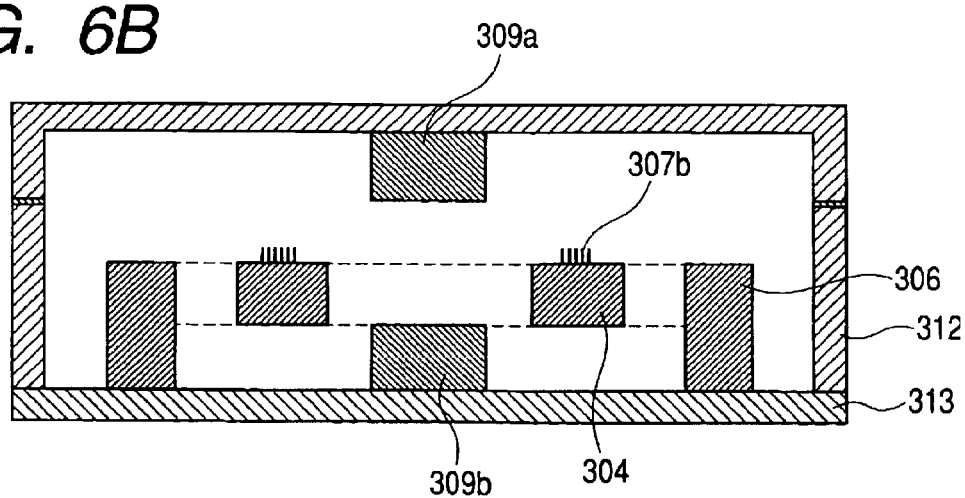

FIGS. 6A and 6B, and FIGS. 7A and 7B are respectively views useful in explaining an optical deflector according to Example 3 of the present invention. FIG. 6A shows a plan view, FIG. 6B shows a cross sectional view taken along the line 6B—6B of FIG. 6A, and FIG. 7A shows a cross sectional view taken along the line 7A—7A of FIG. 6A. A basic structure, a driving method, and a manufacturing method are substantially the same as those of above Example 1. In FIGS. 6A and 6B, and FIGS. 7A and 7B, reference numeral 301 designates an optical deflector; 302, a first torsion spring; 303, a second torsion spring; 304, a first movable plate; 305, a second movable plate; 306, a supporting substrate; 307a, a first coil; 307b, a second coil; 307c, a third coil; 308, a deflection portion; 309a and 309b, second permanent magnets; 310, a first permanent magnet; 314a and 314b, third permanent magnets; 311a, 311b and 311c, current sources; 312, a cover; and 313, a supporting stage. In FIG. 6A, for the purpose of making a structure easy to understand, the second permanent magnet 309a, the third permanent magnet 314a and the cover 312 are not illustrated.

The feature of Example 3 is that plural permanent magnets (the second permanent magnets 309a and 309b, and the third permanent magnets 314a and 314b) are installed in order to drive the first movable plate 304. The second permanent magnets 309a and 309b, and the third permanent magnets 314a and 314b are installed so as to vertically sandwich therebetween the second coil 307b and the third coil 307c on the first movable plate 304, respectively, and their opposite magnetic poles are different from each other. In addition, the first movable plate 304 has an opening portion to avoid the mechanical interference between the second permanent magnets 309a and 309b, and the third permanent magnets 314a and 314b. The first coil 307a, the second coil 307b, and the third coil 307c are electrically connected to the current sources 311a, 311b and 311c, respectively. An opening portion (not shown) is provided in the cover 312 to function as an optical path for a light beam.

The principles of driving the second movable plate 305 round the y-axis, i.e., with the second torsion spring 303 as a center is the same as those in the case of Example 2 in which the second movable plate 205 is driven round the y-axis. Also, the principles of driving the first movable plate 304 round the x-axis, i.e., with the first torsion spring 302 as a center are basically the same as those in the case of Example 2 in which the first movable plate 204 is driven round the x-axis. That is to say, the second permanent magnets 309a and 309b, and the third permanent magnets 314a and 314b are arranged as shown in FIGS. 6A and 6B and FIGS. 7A and 7B, whereby a torque can be obtained with the first torsion spring 302 as a center for the first movable plate 304. With respect to the second and third permanent magnets, a U-like permanent magnet in which the second permanent magnets 309a and 309b, and the third permanent magnets 314a and 314b in FIG. 7A are integrated with one another may be arranged as shown in FIG. 7B.

Currents are caused to flow from the current sources 311a, 311b, and 311c into the first coil 307a, the second coil 307b, and the third coil 307c respectively, whereby the second movable plate 305 having the deflection portion 308 can be oscillated about the two axes. Two or more of the first coil 307a, the second coil 307b, and the third coil 307c may also be electrically connected in series with each other. In this case, one or more of the current sources 311a, 311b, and 311c becomes unnecessary.

The optical deflector of this example structured as described above can deflect a light beam with respect to the two axes with a simple structure since the permanent magnets and the coils are arranged as shown in FIGS. 6A and 6B, and FIGS. 7A and 7B. In addition, since there is no mechanical interference between the movable plates and the permanent magnets, it becomes possible to take large displacement angles of the movable plates. Although an installation area is larger than that in Example 2, since the optical deflector of this example has plural sets of permanent magnets and coils around one axis, a large generation force can be obtained and also a large deflection angle can be taken.

EXAMPLE 4

Figure 8:
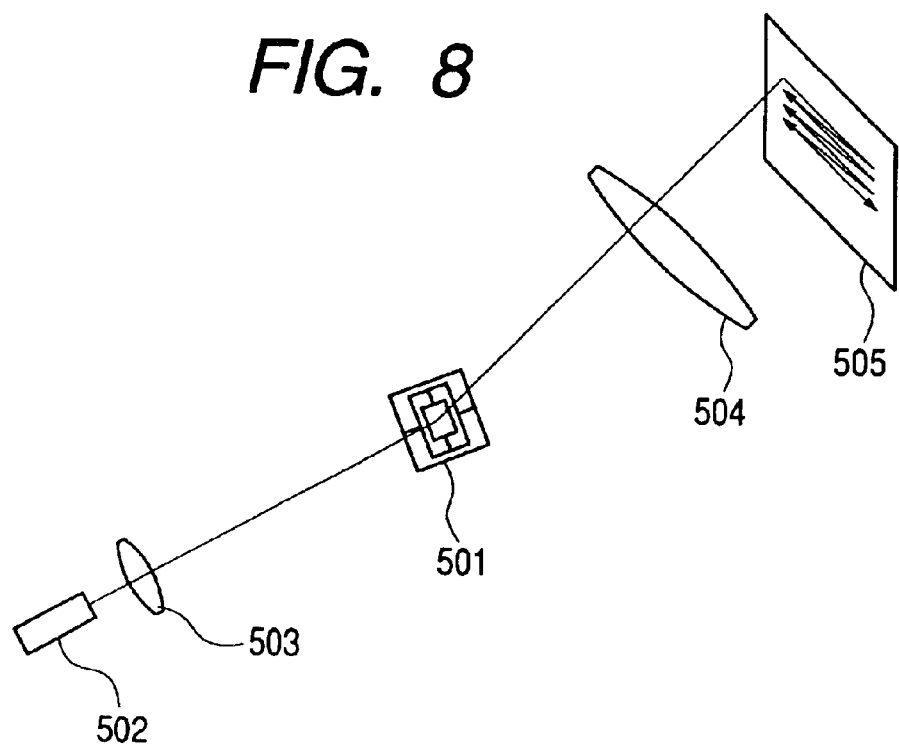
FIG. 8 is a schematic view useful in explaining an example of an image display device according to the present invention.

FIG. 8 is a schematic view showing a basic structure of an image display device according to the present invention as an optical device using the optical deflector of the present invention. In FIG. 8, reference numeral 501 designates an optical deflector shown in the above-mentioned example. In this example, this optical deflector functions as an optical scanner device for raster scanning an objective surface in horizontal and vertical directions with an incident light. Also, reference numeral 502 designates a laser light source; 503, a lens or a lens group; 504, a write lens or a lens group; and 505, a projection surface (image display surface). The optical deflector 501 is arranged between two lenses or lens groups 503 and 504.

Here, a laser beam made incident from the laser light source 502 suffers predetermined intensity modulation concerned with a timing of light scanning, and the laser beam is two-dimensionally scanned by the optical deflector 501, thereby forming an image on the projection surface 505.

EXAMPLE 5

Figure 9:
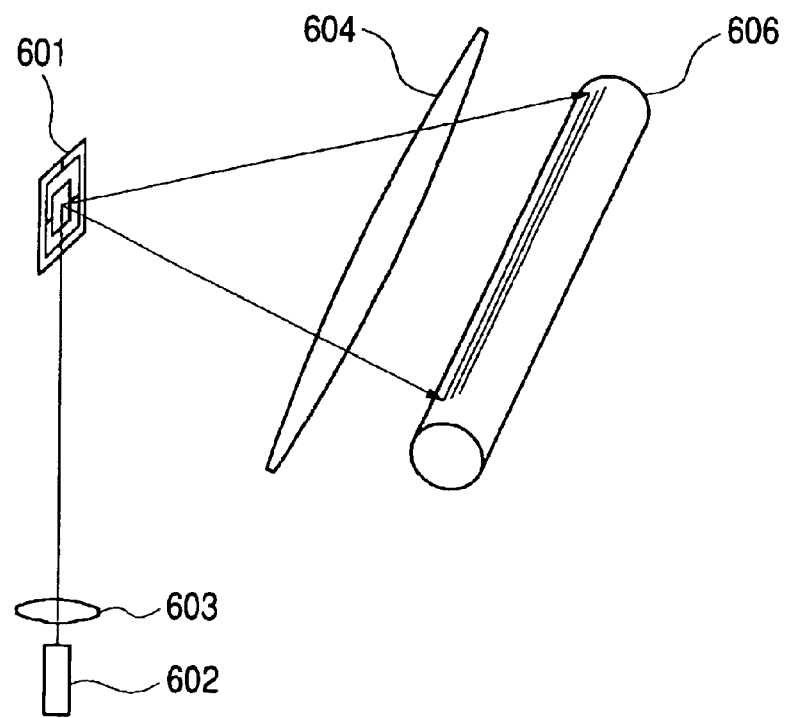
FIG. 9 is a schematic view useful in explaining an example of an image forming apparatus according to the present invention.
Figure 10:
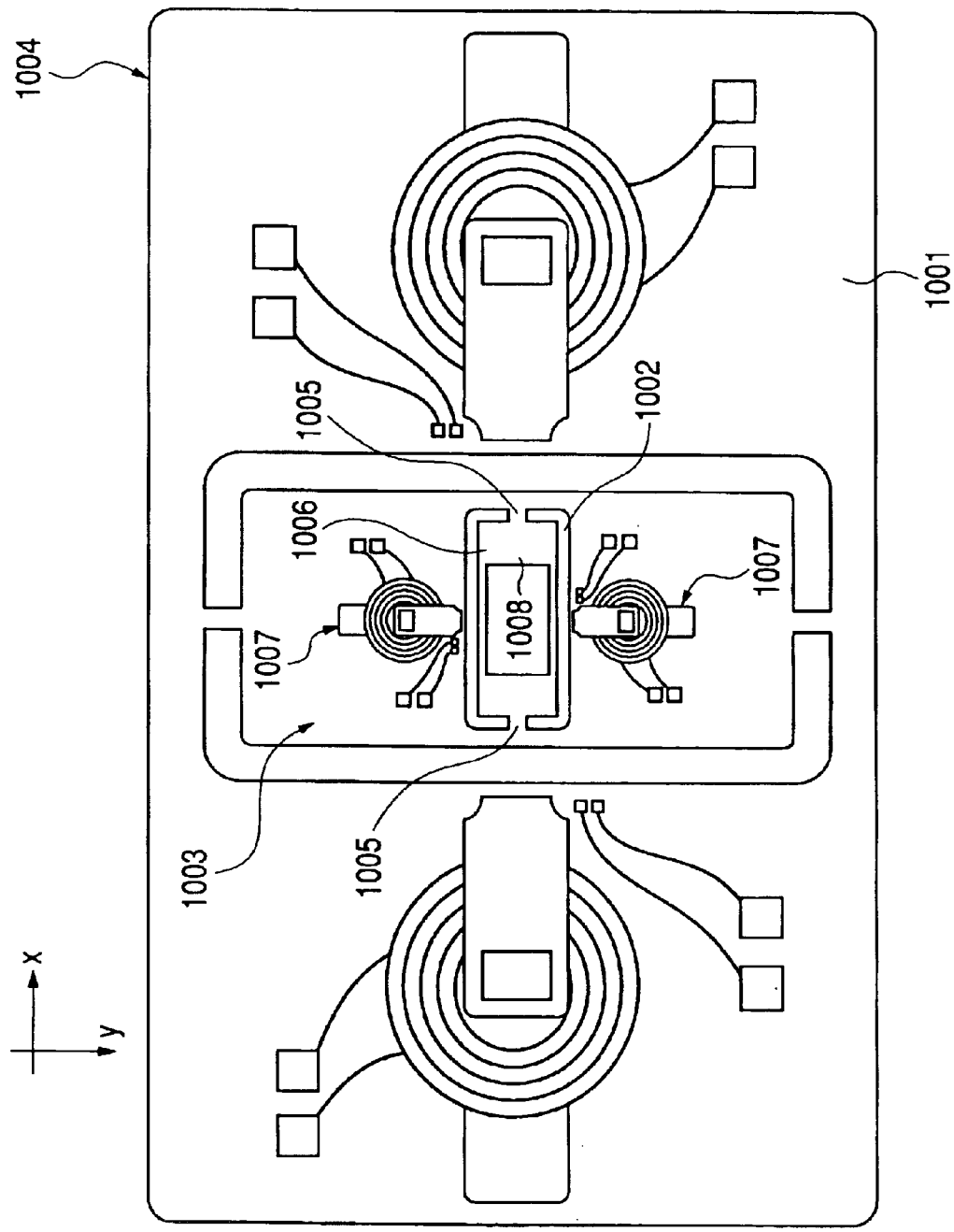
FIG. 10 is a plan view useful in explaining a first background art.
Figure 11:
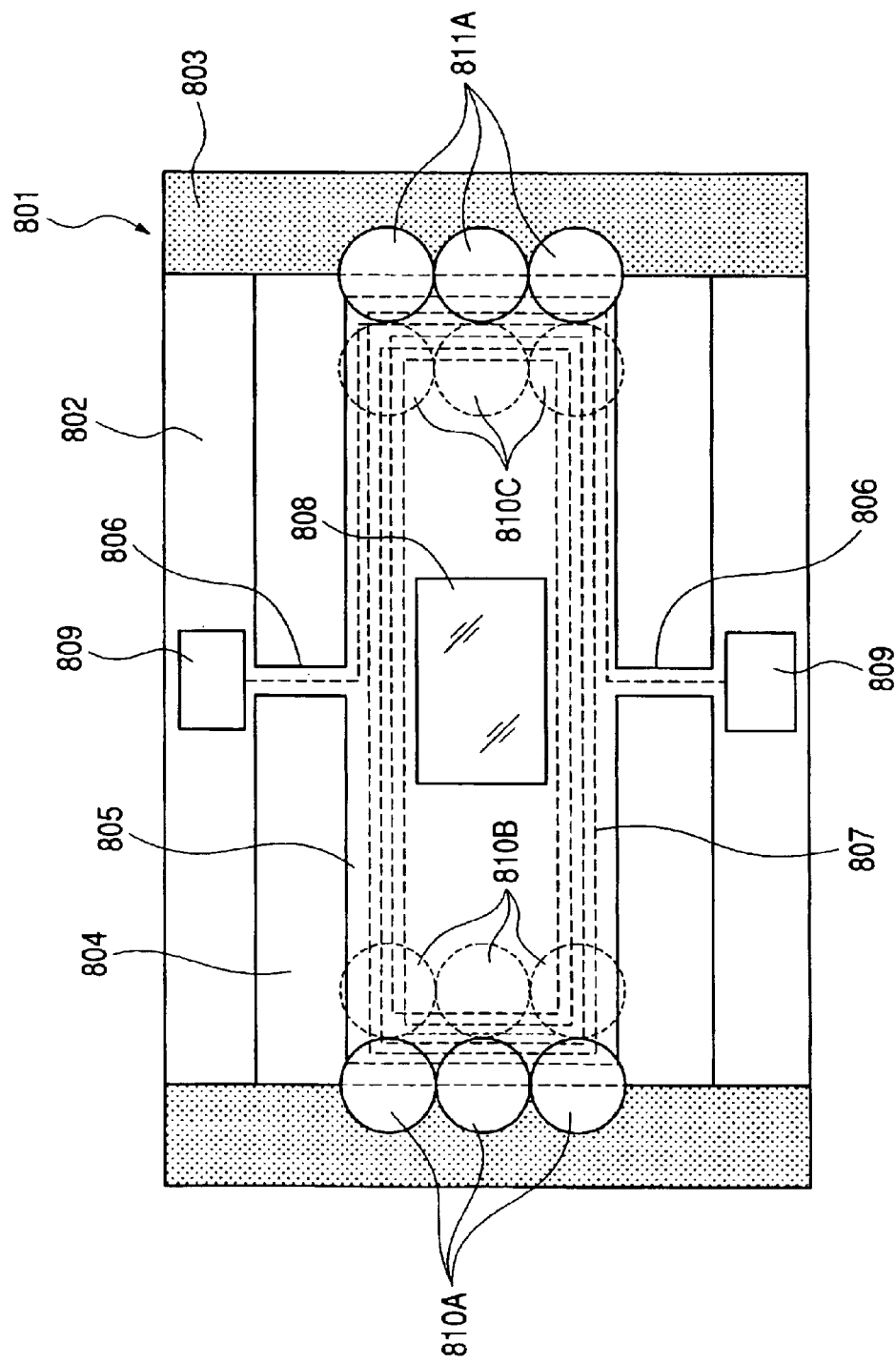
FIG. 11 is a plan view useful in explaining a second background art.
Figure 12:
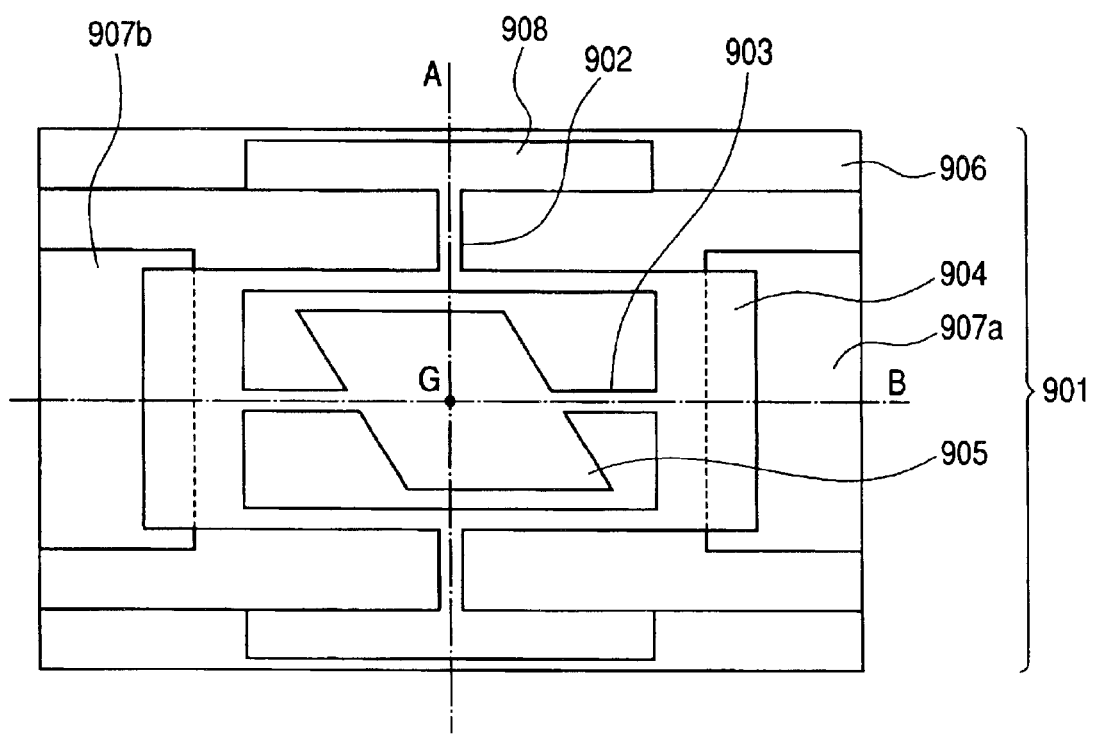
FIG. 12 is a plan view useful in explaining a third background art.

FIG. 9 is a schematic view showing a basic structure of an image forming apparatus according to the present invention as an optical device using the optical deflector of the present invention. In FIG. 9, reference numeral 601 designates an optical deflector which is structured by providing an optical element such as a mirror, a lens or a diffraction grating in a moving element in the optical deflector shown in the above-mentioned example. In this example, this optical deflector functions as an optical scanner device for two-dimensionally scanning an objective surface with an incident light. Also, reference numeral 602 designates a laser light source; 603, a lens or a lens group; 604, a write lens or a lens group; and 606, a drum-shaped photosensitive member (image display surface). The optical deflector 601 is arranged between two lenses or lens groups 603 and 604.

Here, a laser beam made incident from the laser light source 602 suffers predetermined intensity modulation concerned with a timing of light scanning, and the laser beam is two-dimensionally deflected by the optical deflector 601 towards a surface of the drum-shaped photosensitive member 606. Then, the deflected (scanned) laser beam forms an image on the photosensitive member 606 through the write lens 604. On the other hand, the surface of the photosensitive member 606 is uniformly charged with electricity by a charger (not shown). Thus, the light is made incident in the form of a pattern on the surface of the photosensitive member 606 on the basis of the scanning by the optical deflector 601. Then, an electrostatic latent image is formed owing to an area received the incident light and an area received no incident light. A toner image having a pattern corresponding to the electrostatic latent image on the surface of the photosensitive member 606 is formed by a developer (not shown) and then is transferred and fixed on a sheet of paper (not shown) for example to thereby form a visible image.

As described above by giving the preferred embodiment mode and examples, according to the oscillation device for use in the optical deflector or the like of the present invention, a large stroke is easy to be realized. In addition, since a structure which is less in leakage of a magnetic flux can be realized, the energy efficiency becomes excellent. Also, plural electromagnetic coils are used, whereby it is possible to realize the oscillation device for use in the optical deflector or the like which can provide a large generation force and a large displacement angle or a large deflection angle, which can be operated at a high speed, and which is long in life to be excellent in energy efficiency. Also, according to the image display device and the image forming apparatus of the present invention, it is possible to provide the image display device and the image forming apparatus each of which is very miniature and inexpensive.

What is claimed is:

1. An oscillation device comprising:
    a first movable plate adapted to be oscillated about a first rotation axis;
    a first elastic supporting portion for oscillatively supporting the first movable plate;
    a supporting substrate for fixing the first elastic supporting portion;
    a first magnetic field generating portion arranged in a position remote from the first movable plate;
    a second movable plate adapted to be oscillated about a second rotation axis; and
    a second elastic supporting portion fixed to the first movable plate for oscillatively supporting the second movable plate,
    wherein a first coil is provided in the first movable plate to be turned round the second movable plate, and
    wherein a second magnetic field generating portion is provided in the second movable plate.

2. The oscillation device according to claim 1, wherein the first magnetic field generating portion comprises a magnet.

3. The oscillation device according to claim 2, wherein the magnet comprises a permanent magnet.

4. The oscillation device according to claim 1, wherein the second magnetic field generating portion comprises a magnet.

5. The oscillation device according to claim 4, wherein the magnet comprises a permanent magnet.

6. The oscillation device according to claim 1, wherein the first elastic supporting portion comprises a pair of elastic supporting members which are disposed on the same axis and are disposed at both ends of the first movable plate.

7. The oscillation device according to claim 1, wherein the second elastic supporting portion comprises a pair of elastic supporting members which are disposed on the same axis and are disposed at both ends of the second movable plate.

8. The oscillation device according to claim 1, wherein the first coil is formed into a quadrangle in shape to be turned round the second movable plate.

9. The oscillation device according to claim 1, further comprising:
    a second coil that is installed on the first movable plate,
    wherein the first movable plate has a first opening in an inner periphery of the second coil, and
    wherein an N pole and an S pole of the first magnetic field generating portion are arranged in a direction substantially perpendicular to the first movable plate and in a position remote from the first movable plate to sandwich therebetween the first opening.

10. The oscillation device according to claim 9, further comprising:
    a third coil that is installed with the second coil on the first movable plate to sandwich therebetween the first rotation axis,
    wherein the first movable plate has a second opening in an inner periphery of the third coil, and
    wherein an N pole and an S pole of a third magnetic field generating portion are arranged in a direction substantially perpendicular to the first movable plate and in a position remote from the first movable plate to sandwich therebetween the second opening.

11. The oscillation device according to claim 10, wherein a current containing a frequency component of a torsional resonance frequency of the second movable plate is applied to the first coil, and a current containing a frequency component of a torsional resonance frequency of the first movable plate is applied to the second coil or the third coil.

12. An optical deflector comprising:
    an oscillation device according to claim 1; and
    a deflection portion for deflecting an incident light, which is provided in the second movable plate.

13. An image forming apparatus comprising:
    a light source;
    an optical deflector according to claim 12 for deflecting a light emitted from the light source; and
    an image display surface on which the light deflected by the optical deflector is projected.

14. An image forming apparatus comprising:
    a light source;
    an optical deflector according to claim 12 for deflecting a light emitted from the light source; and
    a photosensitive material on which the light deflected by the optical deflector is projected.

15. A method of manufacturing an oscillation device according to claim 1, comprising the steps of:
    forming a movable plate, a elastic supporting portion, and a supporting substrate from a substrate;
    forming a coil in the first movable plate;
    forming a second magnetic field generating portion in the second movable plate; and
    forming a first magnetic field generating portion in the supporting substrate.

16. The method of manufacturing an oscillation device according to claim 15, wherein the forming of the movable plate, the elastic supporting portion, and the supporting substrate from the substrate is carried out by utilizing one of a reactive ion etching method and an etching method using an alkali solution.

* * * * *